United States Patent
Kawamura et al.

(10) Patent No.: US 8,366,903 B2
(45) Date of Patent: Feb. 5, 2013

(54) METHOD FOR MANUFACTURING PRINTED WIRING BOARD AND ELECTROLYTIC ETCHING SOLUTION FOR USE IN THE MANUFACTURING METHOD

(75) Inventors: Toshinori Kawamura, Hitachi (JP); Haruo Akahoshi, Hitachi (JP); Kunio Arai, Ebina (JP)

(73) Assignee: Hitachi Via Mechanics, Kangawa (JP)

( * ) Notice: Subject to any disclaimer, the term of this patent is extended or adjusted under 35 U.S.C. 154(b) by 1137 days.

(21) Appl. No.: 12/222,995

(22) Filed: Aug. 21, 2008

(65) Prior Publication Data
US 2009/0084684 A1    Apr. 2, 2009

(30) Foreign Application Priority Data
Sep. 28, 2007  (JP) ................................. 2007-256528

(51) Int. Cl.
*H05K 3/07*    (2006.01)
(52) U.S. Cl. .................... 205/674; 205/721; 205/772
(58) Field of Classification Search ............... 205/640, 205/674, 704, 721, 772
See application file for complete search history.

(56) References Cited

U.S. PATENT DOCUMENTS

| | | | | |
|---|---|---|---|---|
| 5,284,554 A | * | 2/1994 | Datta et al. | 205/653 |
| 7,666,320 B2 | | 2/2010 | Kawamura et al. | |
| 2005/0145506 A1 | * | 7/2005 | Taylor et al. | 205/658 |
| 2006/0270232 A1 | * | 11/2006 | Kawamura et al. | 438/690 |

FOREIGN PATENT DOCUMENTS

| | | |
|---|---|---|
| CN | 1874655 | 12/2006 |
| JP | 2007-129147 | 5/2007 |
| JP | 2007-173683 | 7/2007 |

* cited by examiner

*Primary Examiner* — In Suk Bullock
*Assistant Examiner* — Paul Hyun
(74) *Attorney, Agent, or Firm* — Wenderoth, Lind & Ponack, L.L.P.

(57) ABSTRACT

In a method of manufacturing a printed wiring board, a via reaches from a surface copper layer to an inner-layer copper layer of a multilayer board, and copper layers and insulating layers are alternately layered. The wiring board is machined by a laser, and a process of machining the via includes forming a laser absorbing layer on a surface of a copper layer disposed on the surface of the multilayer board. The laser is irradiated, and an electrolytic etching and removal of the laser absorbing layer is carried out in this order.

4 Claims, 5 Drawing Sheets

ELECTROLYTIC MOLTEN AND
SCATTERED Cu ETCHING PROCESS

FIG.1A FORM LASER ABSORBING LAYER
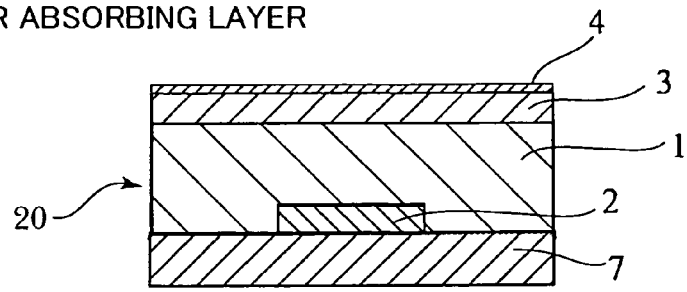
FIG.1B MACHINE VIA BY LASER    LASER LIGHT
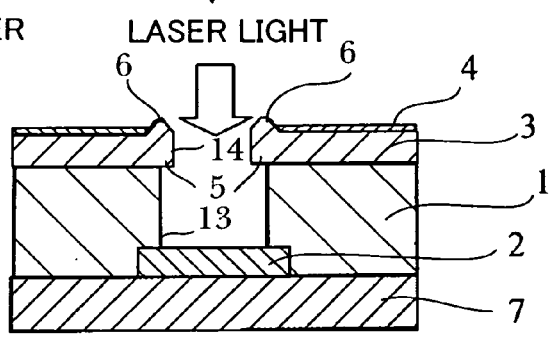
FIG.1C ELECTROLYTIC MOLTEN AND SCATTERED Cu ETCHING PROCESS
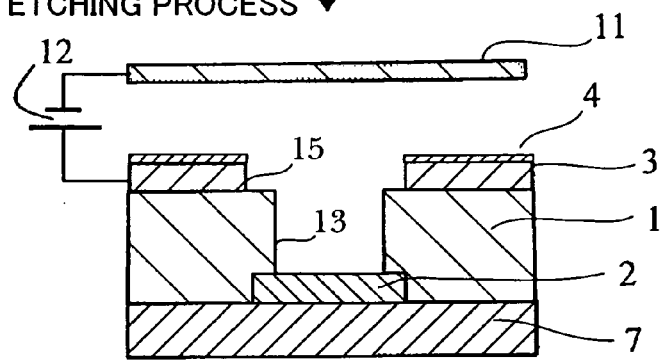
FIG.1D REMOVE LASER ABSORBING LAYER
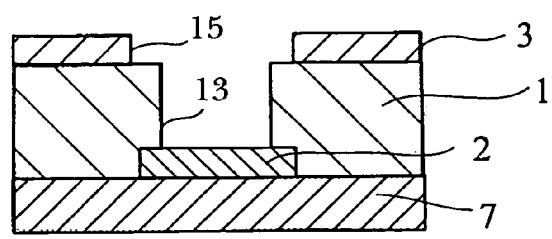

FIG. 3

| | LASER ABSORBING LAYER | ETCHING SOLUTION | | CURRENT DENSITY A/cm² | TREATMENT TIME sec. |
|---|---|---|---|---|---|
| | | COMPOSITION | pH | | |
| 1ST EMBODIMENT | FILM RESIST | PHOSPHORIC ACID: 7.0 mol/l | 1.0 | 0.7 | 60 |
| 2ND EMBODIMENT | COPPER OXIDE | AMMONIUM SULFATE: 0.8 mol/l SODIUM CHLORIDE: 0.1 mol/l | 8.5 | 0.7 | 60 |
| 3RD EMBODIMENT | COPPER OXIDE | SODIUM SULFATE: mol/l: 0.8 mol/l | 8.5 | 0.7 | 60 |
| 4TH EMBODIMENT | COPPER OXIDE | POTASSIUM SULFATE: mol/l: 0.6 mol/l | 8.5 | 0.7 | 60 |
| 5TH EMBODIMENT | COPPER OXIDE | SODIUM SULFATE: mol/l: 0.8 mol/l | 5.0 | 0.7 | 60 |
| 6TH EMBODIMENT | COPPER OXIDE | SODIUM SULFATE: mol/l: 0.8 mol/l | 11.0 | 0.7 | 60 |
| 7TH EMBODIMENT | FILM RESIST | PHOSPHORIC ACID 7.0 mol/l | 1.0 | 0.7 | 60 |
| 8TH EMBODIMENT | FILM RESIST | AMMONIUM PERSULFATE: 0.8 mol/l SULFURIC ACID: 0.9 mol/l | 1.0 | - | 120 |
| 9TH EMBODIMENT | COPPER OXIDE | SODIUM SULFATE: mol/l: 0.8 mol/l | 4.0 | 0.7 | 60 |
| 10TH EMBODIMENT | COPPER OXIDE | PHOSPHORIC ACID: mol/l: 7.0 mol/l | 1.0 | 0.7 | 60 |

FIG. 4

| | REMOVAL RESULT OF MOLTEN AND SCATTERED Cu | REMOVAL RESULT OF OVERHANG | DECREASE OF OUTER-LAYER COPPER FOIL | DECREASE OF INNER-LAYER WIRING |
|---|---|---|---|---|
| 1ST EMBODIMENT | GOOD | GOOD | NONE | NONE |
| 2ND EMBODIMENT | GOOD | GOOD | NONE | NONE |
| 3RD EMBODIMENT | GOOD | GOOD | NONE | NONE |
| 4TH EMBODIMENT | GOOD | GOOD | NONE | NONE |
| 5TH EMBODIMENT | GOOD | GOOD | NONE | NONE |
| 6TH EMBODIMENT | GOOD | GOOD | NONE | NONE |
| 7TH EMBODIMENT | GOOD | GOOD | DECREASED | NONE |
| 8TH EMBODIMENT | GOOD | FAIR | NONE | DECREASED |
| 9TH EMBODIMENT | GOOD | GOOD | DECREASED | NONE |
| 10TH EMBODIMENT | GOOD | GOOD | DECREASED | NONE |

METHOD FOR MANUFACTURING PRINTED WIRING BOARD AND ELECTROLYTIC ETCHING SOLUTION FOR USE IN THE MANUFACTURING METHOD

CROSS REFERENCE TO RELATED APPLICATION

This application claims priority from a Japanese Patent Application No. 2007-256528 filed on Sep. 28, 2007, the contents of which are incorporated herein by reference.

BACKGROUND OF THE INVENTION

Field of the Invention

The present invention relates to a method for manufacturing a printed wiring board in which a via is machined by means of a laser, and to an electrolytic etching solution for use in this manufacturing method.

With the miniaturization and lightening of late electronic devices, printed wiring boards are being densified further and hence are multi-stratified. It is necessary for the multi-stratification to assure conduction between wiring layers on which circuits are formed while interposing insulating layers, and the inter-layer connection has become an essential element in a technology for manufacturing the multilayer printed wiring boards.

Means of the inter-layer connection of the wiring layers includes a through-hole and a blind hole or an interstitial via hole that are non-through-holes. Although a method for forming such holes includes drilling, laser machining and the like, the laser machining has become a mainstream from aspects of miniaturization of a diameter of machined holes and of high machining speed. Above all, a $CO_2$ laser that has high laser energy is most popular. However, it has been difficult to machine such holes by the $CO_2$ laser because a laser beam is reflected from a surface of a copper layer in a wavelength range of the $CO_2$ laser.

Then, a large window method has been adopted as a hole forming method. According to this method, machining is carried out after removing only a copper layer at a peripheral part of a hole to be formed in advance by etching. However, it has been difficult to miniaturize a wiring design by the large window method because this method requires a process of patterning the copper layer and a diameter of a window that is about twice that of a diameter of the laser to permit a misalignment of position of the irradiated laser.

Then, there has been studied a so-called 'direct via machining' of machining the copper layer and the insulating layer in the same by the laser to machine a via that reaches an innerlayer copper layer from a surface copper layer.

The direct via machining is arranged so as to be able to machine the copper layer by providing a laser absorbing layer on the surface of the copper layer to enhance an absorption factor of the laser light. A method for forming the laser absorbing layer includes an oxide conversion coating process of forming a copper oxide film on the surface of the copper layer, a process of roughening the surface of the copper layer by means of copper grain boundary etching, a method of adhering a film containing organics or an etching resist and the like.

FIGS. 5A and 5B are schematic diagrams showing molten scattered Cu and an overhang generated by carrying out the direct via machining to a copper-clad laminate 20, wherein FIG. 5A is a plan view thereof and FIG. 5B is a section view seen along arrows A-A in FIG. 5A.

When the direct via machining is performed by irradiating a laser beam to a copper-clad laminate 20 in which an outerlayer copper layer 3 is formed on an insulating layer 1 having an innerlayer wire 2 and a laser absorbing layer 4 is formed on a surface of the copper-clad laminate 20 as a copper oxide film, molten-splashed Cu 6 melted by heat of the laser is generated around an opening of the hole. A so-called overhang 5 that reduces a diameter of a via 13 of the insulating layer 1 to a diameter of a hole 14 of the outerlayer copper layer 3 also arises around the opening of the via. It is necessary to remove the overhang 5 and the molten scattered Cu 6 because the overhang 5 lower the uniformity of the plated copper thickness inside the via-hole (13), and the molten scattered Cu 6 decreases flatness during lamination in the later processes. The method for removing the overhang 5 and the molten scattered Cu 6 includes a physical polishing using a buff and the like, and a chemical etching using a chemical solution. However, a thickness of the copper layer as a wire (referred to as a "wiring thickness" hereinafter) is reduced by the physical polishing using the buff and the like. The wiring thickness is also reduced by the chemical etching because the outerlayer copper layer 3 and the innerlayer wire 2 are also etched. Reference numeral 7 in FIG. 5 denotes an innerlayer base material (insulator).

Then, the inventor has proposed to carry out a direct via machining process, i.e., a process of machining a via by means of a laser, including steps of forming an oxide film on a surface of a copper layer, machining the via by means of the laser, treating by an alkali, etching molten-scattered Cu and de-smearing, in this order, as disclosed in Japanese Patent Laid-Open No. 2007-129147. In fact, this technology allowed the molten scattered Cu and the overhang to be removed while suppressing the decrease of the thickness of wires as compared to the prior art.

However, in the case of the technology disclosed in JP2007-129147A, the thickness of the wires decreased even though it was very small (around 1 μm).

Still more, when there was no smear (insulator composed of a composition of the insulating layer) on a bottom of the via 13, the bottom was etched.

It was also necessary to improve the workability further.

Accordingly, the present invention seeks to provide a method for manufacturing a printed wiring board that allows the molten scattered Cu and the overhang which are unnecessary machining by-products to be removed while scarcely reducing the wiring thickness, and an electrolytic etching solution suitably used in this manufacturing method.

SUMMARY OF THE INVENTION

In order to solve the aforementioned problem, according to a method of the invention for manufacturing a printed wiring board in which a via that reaches from a surface copper layer to an inner-layer copper layer of a multilayer substrate in which copper layers and insulating layers are alternately layered is formed by means of a laser, a process of forming the via includes steps of: forming a laser absorbing layer on the surface of the copper layer disposed on the surface of the multilayer board; irradiating the laser to the laser absorbing layer to form the via; performing an electrolytic etching to remove unnecessary machining by-products that has been generated around the via of the surface copper layer in forming the via; and removing the laser absorbing layer.

Still more, an electrolytic etching solution of the invention used in the electrolytic etching step in the method for manufacturing the printed wiring board contains alkali metal ions and inorganic ligands that form a chemical compound with copper and has pH 5 or more.

The method for manufacturing the printed wiring board of the invention allows the unnecessary machining by-products to be selectively removed while scarcely decreasing the thickness of the wires. The method also allows the workability to be improved further.

Additional objects and advantages of the present invention will be apparent from the following detailed description with reference to the accompanying drawings.

BRIEF DESCRIPTION OF THE DRAWINGS

FIGS. 1A through 1D are diagrams showing a procedure of a direct via machining process of the invention;

FIG. 3 is a table showing compositions and conditions of electrolytic etching solutions;

FIG. 4 is a table showing results obtained by evaluating states of removal of molten scattered Cu and overhang and reduction rate of a thickness of copper layers.

DETAILED DESCRIPTION OF THE INVENTION

Figure 2A:
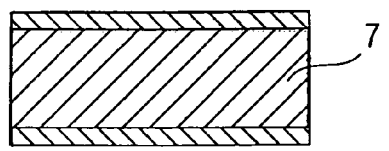
FIGS. 2A through 2H are schematic diagrams showing a process for manufacturing a printed wiring board of the invention.

Preferred embodiments of the invention will be explained below with reference to the drawings, which do not intend to limit the scope of the invention, but exemplify the invention. All of the features and the combinations thereof described in the embodiments are not necessarily essential to the invention.

FIGS. 1A through 1D are diagrams showing a procedure of a direct via machining process in a method for manufacturing a printed wiring board of the invention.

According to the invention, the direct via machining process is carried out by (A) forming a laser absorbing layer, (B) machining a via by means of a laser, (C) electrolytically etching molten scattered Cu (electrolytic etching process) and (D) removing the laser absorbing layer as shown in FIGS. 1A through 1D in this order. Note that a de-smearing process for removing residues at a bottom of the via may be carried out after the direct via machining process as necessary.

The direct via machining process of the invention features two points. One of the feature is that the laser absorbing layer 4 formed on a surface of an outerlayer copper layer 3 is left until the molten scattered Cu and the overhang are removed. Therefore, the laser absorbing layer 4 that is made of a material other than copper can be used as an etching mask so as to be able to remove only the molten scattered Cu and the overhang that are made of a copper material. The other feature is that an electrolytic etching is used as a method for removing the molten scattered Cu 6 and the overhang 5 so as to be able to etch only the outerlayer copper layer 3 by attaining an electrical conduction only with the outerlayer copper layer 3. These features allow the molten scattered Cu 6 and the overhang 5 to be selectively removed without decreasing a thickness of the outerlayer copper layer 3 and the innerlayer wire 2.

Although a material of the laser absorbing layer 4 in this direct via machining process is not specifically limited, it is preferable to use a material other than copper because it is used as the etching mask of copper. For instance, a film or an etching resist containing organic substances or a copper oxide that forms an organic film and that is formed by a surface treatment or an oxide conversion coating process may be used.

Here, an oxide film may be formed on the surface of the copper layer by forming a copper oxide film having a thickness of 0.5 µm or more as the laser absorbing layer 4 on the surface of the outerlayer copper layer 3. Etching resistance of the copper oxide film drops when the thickness thereof is less than 0.5 µm and it becomes difficult to distinguish and select the molten scattered Cu 6 and the copper oxide film from other parts (selectivity drops). An oxide conversion coating process that roughens the surface of the copper layer and forms the copper oxide in the same time is used as a copper oxide film forming method in the invention. An oxide conversion coating treatment solution to be used in the invention is not specifically limited and a commercially-sold treatment solution was used.

The electrolytic etching solution to be used in the electrolytic molten scattered Cu etching process differs depending on a type or chemical resistance of the laser absorbing layer 4.

When an acid resistant etching resist or organic film is used as the laser absorbing layer 4, it is possible to conduct the treatment by using a generally known acid electrolytic Cu etching treatment solution containing phosphoric acid, sulfuric acid and the like as the electrolytic etching solution.

When the copper oxide is used as the laser absorbing layer 4, the copper oxide is readily dissolved by a strongly acidic electrolytic etching solution, so that it is desirable to use an electrolytic etching solution having pH 5 or more. It is preferable to use an electrolytic etching solution of the invention containing alkali metal ions and inorganic ligands that form a chemical compound with copper and having pH 6 through pH 11. Note that the ligand is an ion having a bonding force with a Cu ion and is a sulfuric ion, a chloride ion or an ammonium ion here. A feature of the electrolytic etching solution of the invention is that the electrolytic etching solution suppresses dissolution of the copper oxide and dissolves copper preferentially.

Note that although the laser used in the direct via machining is not specifically limited to those having wavelength ranges of ultraviolet ray and infrared ray, a $CO_2$ laser having a wavelength of 9.3 to 10.6 µm was used in the embodiments described below.

The printed wiring board to which the invention is applied is a generally known rigid or flexible circuit board having copper layers on both surfaces or one surface of a resin or a resin containing a glass fabric.

First Embodiment

FIGS. 2A through 2H are schematic diagrams showing a process for manufacturing a printed wiring board of the invention, wherein FIGS. 2A through 2D show a process for forming an innerlayer wire and FIGS. 2E through 2H show a process for forming an outerlayer circuit.

Figure 2B:
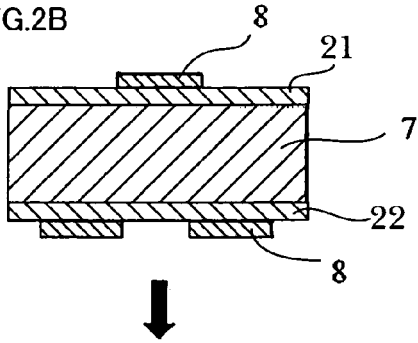
Figure 2C:
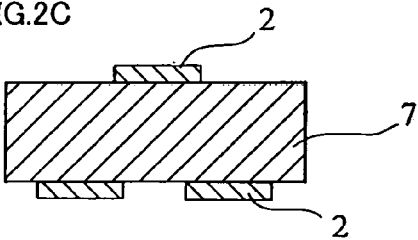
Figure 2D:
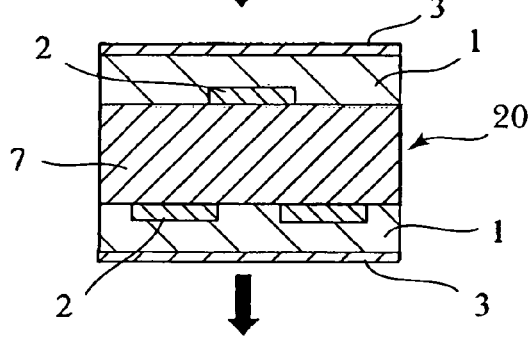
Figure 2E:
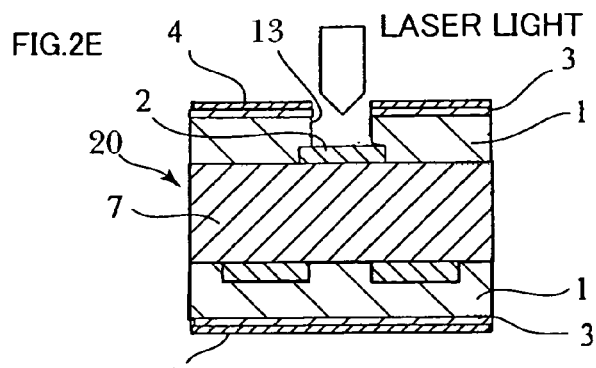

FIG. 2A is a schematic diagram of the innerlayer base material 7. In the present embodiment, the innerlayer wire 2 was formed by using a copper-clad laminate MCL-E679 manufactured by Hitachi Chemical Co., Ltd. as the innerlayer base material by forming innerlayer wiring resist patterns on copper layers 21 and 22 as shown in FIG. 2B and then by removing Cu by etching by using the resist as a mask as shown in FIG. 2C. Next, a polyimide sheet laminated with a copper layer on one surface is laminated by means of press to the innerlayer base material 7 on which the innerlayer wires 2 have been formed to fabricate a four-layered copper-clad laminate 20 as shown in FIG. 2D. A thickness of the polyimide layer (insulating layer) 1 was 60 μm and a thickness of the outerlayer copper layer 3 was 12 μm. Then, the direct via machining was carried out as shown in FIG. 2E.

The direct via machining process in the case of using an etching resist film is used as the laser absorbing layer 4 will be explained in the first embodiment with reference to FIG. 1.

(1) Forming Laser Absorbing Layer (FIG. 1A)

A process of adhering the etching resist film was carried out at first to form the laser absorbing layer 4 on the surface of the outerlayer copper layer 3 of the copper-clad laminate 20. The etching resist film used was H-9025K manufactured by Hitachi Chemical Co., Ltd. and the adhesion process was carried out under conditions of 110° C. of temperature and 0.4 Mpa of pressure. Then, the etching resist film was hardened by exposing it with 80 mJ/cm$^2$.

(2) Machining Via by Laser (FIG. 1B)

Next, a blind via machining was carried out on the copper-clad laminate 20 adhered with the etching resist film by means of the $CO_2$ laser with 18 mJ of laser energy. A diameter of the via was 100 μm.

(3) Electrolytic Molten Scattered Cu Etching Process (Electrolytic Etching Process) (FIG. 1C)

Next, an electrolytic etching process was carried out to remove the molten scattered Cu 6 and the overhang 5. That is, a DC voltage was applied between the outerlayer copper layer 3 and an electrode 11 from a DC power source 12. Stainless steel plate was used as the electrode 11 and the outerlayer copper layer 3 was set at the plus side. Note that insoluble titanium (Ti), platinum (Pt) or the like may be used as the electrode instead of stainless steel.

The etching was carried out by using 7.0 mol/l of phosphoric acid having pH 1.0 as the electrolytic etching solution under treatment conditions of 0.7 A/cm$^2$ of current density and 60 sec. of treatment time as shown in FIG. 3. It is preferable to appropriately change the treatment conditions of the electrolytic etching solution because the treatment conditions vary depending on the thickness of the outerlayer copper layer 3, the diameter of the via 13 and a quantity of the overhang. The quantity of the overhang is a difference between the diameter of the hole 14 formed through the outerlayer copper layer 3 and the diameter of the via 13.

(4) Laser Absorbing Layer Removing Process (FIG. 1D)

Next, a process of removing the etching resist film was carried out by means of 2.5% of a sodium hydroxide aqueous solution.

Figure 2F:
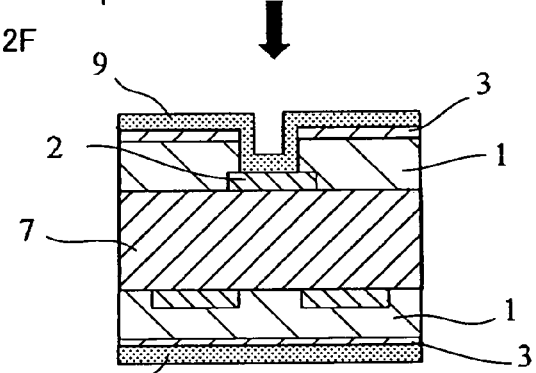
Figure 2G:
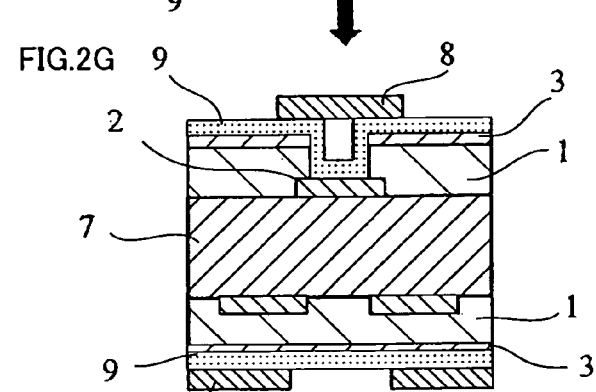
Figure 2H:
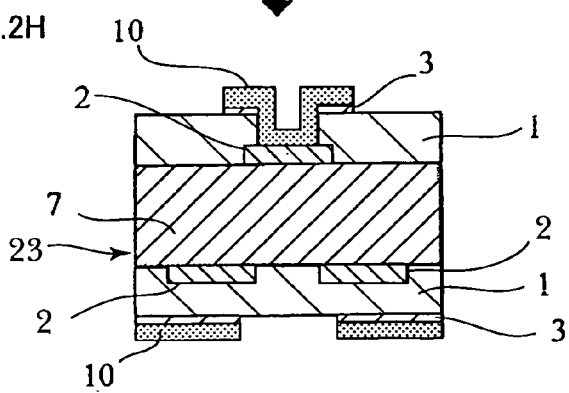
Figure 5A:
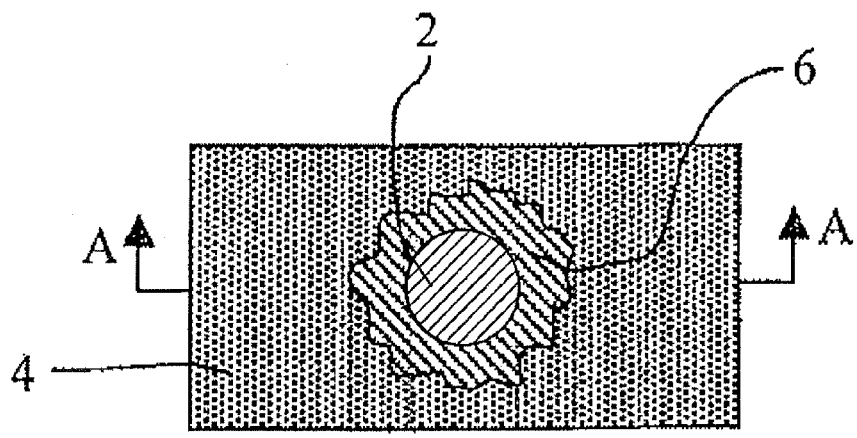
FIGS. 5A and 5B are schematic diagrams for explaining removal of the molten scattered Cu and the overhang in a prior art.
Figure 5B:
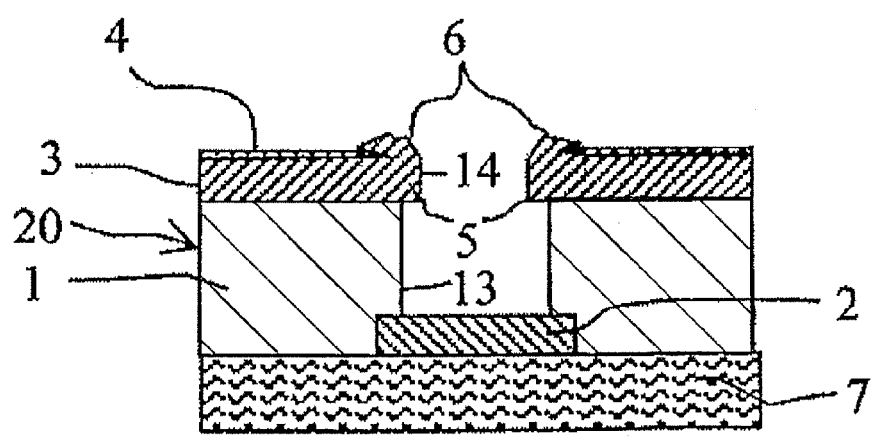

After the direct via machining process, the outerlayer circuit was formed as shown in FIGS. 2F through 2H. At first, a copper plating film 9 of 15 μm thick was formed to achieve interlayer conduction of the machined blind via. Next, an outerlayer circuit resist pattern 8 was formed on the copper plating film 9 as shown in FIG. 2G and an outerlayer circuit 10 was formed by etching by using ferric chloride as shown FIG. 2H. A multilayer printed wiring board 23 was thus fabricated as a multilayer substrate.

A cross-section of the multilayer wiring board fabricated as described above was observed after the direct via machining process in FIG. 2E to examine a status of the removal of the molten scattered Cu 6 and the overhang 5 and a status of the decrease of the thickness of the outerlayer copper layer 3 and the innerlayer wire 2 that might have occurred due to the etching.

As a result of the observation, it was found that the molten scattered Cu 6 and the overhang 5 were all removed as shown in the table in FIG. 4. It was also found that an outside view of the via was the same with a shape of the via of the outerlayer copper layer 3 etched by the large window method before laser machining and that the outerlayer copper layer 3 was etched thoroughly as a circle 15 that is slightly larger than the diameter of the via 13. Further, it was found that the thickness of the outerlayer copper layer 3 and the innerlayer wire 2 scarcely decreased due to the etching.

Note that the thickness of the innerlayer wire 2 scarcely decreased due to the etching even when no smear exists at the bottom of the via 13.

It is also noted that although the current density was set at 0.7 A/cm$^2$ in the present embodiment, it is possible to shorten the treatment time further by increasing the current density because the treatment time is inversely proportional to the current density. That is, the present embodiment allows the workability to be improved as compared to the technology of JP2007-129147A.

Second Embodiment

The direct via machining process in the case of using the copper oxide formed by the oxide conversion coating process is used as the laser absorbing layer 4 will be explained with reference to FIG. 1.

(1) Forming Laser Absorbing Layer (FIG. 1A)

An oxide conversion coating process was carried out first to form the laser absorbing layer 4 on the surface of the outerlayer copper layer 3 of the copper-clad laminate 20. An oxide conversion coating treatment solution used was HIST-500 manufactured by Hitachi Chemical Co., Ltd. and the treatment was carried out under conditions of 75° C. of solution temperature and eight minutes of treatment time. A thickness of the copper oxide to be formed was preferable to be thick from an aspect of etching resistance thereof.

(2) Machining Via by Laser (FIG. 1B)

Next, a blind via machining was carried out on the copper-clad laminate 20 to which the oxide conversion coating treatment had been carried out by means of the $CO_2$ laser with 18 mJ of laser energy. A diameter of the via was 100 μm.

(3) Electrolytic Molten and Scattered Cu Etching Process (Electrolytic Etching) (FIG. 1C)

Next, an electrolytic etching process was carried out to remove the molten scattered Cu 6 and the overhang 5. The electrolytic etching solution was 0.8 mol/l of ammonium sulfuric acid and 0.1 mol/l of sodium chloride as shown in the table in FIG. 3. Although pH was controlled to pH 8.5 by sodium hydroxide, an alkaline buffer solution may be also used. The etching was carried out under treatment conditions of 0.7 A/cm$^2$ of current density and 60 sec. of treatment time. It is preferable to appropriately change the treatment conditions of the electrolytic etching solution because the treatment conditions vary depending on the thickness of the outerlayer copper layer 3, the diameter of the via 13 and the quantity of the overhang. The quantity of the overhang is a difference between the diameter of the hole 14 formed through the outerlayer copper layer 3 (FIG. 1) and the diameter of the via 13.

(4) Laser Absorbing Layer Removing Process (FIG. 1D)

Next, a process of removing the copper oxide was carried out to remove the laser absorbing layer 4. A treatment solution used here was 5% sulfuric acid and a treatment time was 120 sec.

After the direct via machining process described above, the outer-layer circuit 10 was formed as shown in FIGS. 2F through 2H. The copper plating film 9 having 15 μm of thickness was formed to achieve interlayer conduction of the machined blind via as shown in FIG. 2F. Next, the outerlayer circuit resist pattern 8 was formed on the copper plating film 9 as shown in FIG. 2G and the outer-layer circuit 10 was formed by means of etching by using ferric chloride as shown FIG. 2H. The multilayer printed wiring board 23 was thus fabricated.

A cross-section of the multilayer wiring board 23 fabricated as described above was observed after the direct via machining process in FIG. 2E to examine a status of the removal of the molten scattered Cu 6 and the overhang 5 and a status of the decrease of the thickness of the outerlayer copper layer 3 and the innerlayer wire 2 that might have occurred due to the etching process.

As a result of the observation, it was found that the molten scattered Cu 6 and the overhang 5 were all removed as shown in FIG. 4. It was also found that an outside view of the via was the same with the shape of the via of the outerlayer copper layer 3 etched before the laser machining by the large window method and that the outerlayer copper layer 3 was etched thoroughly as a circle 15 that is slightly larger than the diameter of the via 13. Further, it was found that the thickness of the outerlayer copper layer 3 and the innerlayer wire 2 scarcely decreased due to the etching.

Third Embodiment

A multilayer printed wiring board was fabricated in the same manner with the second embodiment while changing a type of the electrolytic etching solution of the electrolytic molten scattered Cu etching in FIG. 1C in the direct via machining process in the case of using the copper oxide made by the oxide conversion coating process as the laser absorbing layer 4 and a cross-section thereof after the direct via machining process in FIG. 2E was observed. The electrolytic etching solution was 0.8 mol/l of sodium sulfuric acid (sodium sulfate) as shown in FIG. 3. Although pH was controlled to pH 8.5 by using sodium hydroxide, an alkaline buffer solution may be used. The treatment was carried out under the conditions of 0.7 A/cm$^2$ of current density and 60 sec. of treatment time.

As a result of the observation, it was found that the molten scattered Cu 6 and the overhang 5 were all removed as shown in FIG. 4 and that the thickness of the outerlayer copper layer 3 and the innerlayer wire 2 scarcely decreased due the etching.

Fourth Embodiment

A multilayer printed wiring board was fabricated in the same manner with the second embodiment while changing a type of the electrolytic etching solution of the electrolytic molten scattered Cu etching in FIG. 1C in the direct via machining process in the case of using the copper oxide made by the oxide conversion coating process as the laser absorbing layer 4 and a cross-section thereof after the direct via machining process in FIG. 2E was observed. The electrolytic etching solution used was 0.6 mol/l of potassium sulfuric acid (potassium sulfate) as shown in FIG. 3. Although pH was controlled to pH 8.5 by using potassium hydroxide, an alkaline buffer solution may be used. The treatment was carried out under the conditions of 0.7 A/cm$^2$ of current density and 60 sec. of treatment time.

As a result of the observation, it was found that the molten scattered Cu 6 and the overhang 5 were all removed as shown in FIG. 4 and that the thickness of the outerlayer copper layer 3 and the innerlayer wire 2 scarcely decreased due to the etching.

Fifth Embodiment

A multilayer printed wiring board was fabricated in the same manner with the second embodiment while changing a type of the electrolytic etching solution of the electrolytic molten scattered Cu etching in FIG. 1C in the direct via machining process in the case of using the copper oxide made by the oxide conversion coating process as the laser absorbing layer 4 and a cross-section thereof after the direct via machining process in FIG. 2E was observed. The electrolytic etching solution used was 0.8 mol/l of sodium sulfuric acid as shown in FIG. 3. Although pH was controlled to pH 5.0 by using sodium hydroxide, an acid buffer solution may be used. The treatment was carried out under the conditions of 0.7 A/cm$^2$ of current density and 60 sec. of treatment time.

As a result of the observation, it was found that the molten scattered Cu 6 and the overhang 5 were all removed as shown in FIG. 4 and that the thickness of the outerlayer copper layer 3 and the innerlayer wire 2 scarcely decreased due to the etching. However, the copper oxide dissolved slightly and an oxide thickness thereof decreased.

Sixth Embodiment

A multilayer printed wiring board was fabricated in the same manner with the second embodiment while changing a type of the electrolytic etching solution of the electrolytic molten scattered Cu etching in FIG. 1C in the direct via machining process in the case of using the copper oxide made by the oxide conversion coating process as the laser absorbing layer 4 and a cross-section thereof after the direct via machining process in FIG. 2E was observed. The electrolytic etching solution used was 0.8 mol/l of sodium sulfuric acid (sodium sulfate) as shown in FIG. 3. Although pH was controlled to pH 11.0 by using sodium hydroxide, an alkaline buffer solution may be used. The treatment was carried out under the conditions of 0.7 A/cm$^2$ of current density and 60 sec. of treatment time.

As a result of the observation, it was found that the molten scattered Cu 6 and the overhang 5 were all removed as shown in FIG. 4, and that the thickness of the outerlayer copper layer 3 and the innerlayer wire 2 scarcely decreased due to the etching. However, the copper oxide dissolved slightly and a thickness thereof decreased.

Seventh Embodiment

The order of the direct via machining process was changed. That is, the multilayer printed wiring board was fabricated in the same manner with the first embodiment by carrying out the process for removing the laser absorbing layer in FIG. 1D before the electrolytic etching of the molten scattered Cu in FIG. 1C and a cross-section of the printed wiring board after the direct via machining process in FIG. 2E was observed.

(1) Forming Laser Absorbing Layer (FIG. 1A)

A process of adhering the etching resist film was carried out at first to form the laser absorbing layer 4 on the surface of the outerlayer copper layer 3 of the copper-clad laminate 20. The etching resist film used was H-9025K manufactured by Hitachi Chemical Co., Ltd. and the adhesion process was performed under conditions of 110° C. of temperature and 0.4 Mpa of pressure. Then, the etching resist film was hardened by exposure with 80 mJ/cm$^2$.

(2) Machining Via by Laser (FIG. 1B)

Next, a blind via machining was carried out on the copper-clad laminate 20 adhered with the etching resist film by means of the CO$_2$ laser with 18 mJ of laser energy. A diameter of the via was 100 μm.

(3) Laser Absorbing Layer Removing Process (FIG. 1D)

Next, a process of removing the etching resist film was carried out by using 2.5% sodium hydroxide aqueous solution.

(4) Electrolytic Molten Scattered Cu Etching Process (Electrolytic Etching Process) (FIG. 1C)

Next, an electrolytic etching process was carried out to remove the molten scattered Cu 6 and the overhang 5. The etching was carried out by using an electrolytic etching solution of 7.0 mol/l of phosphoric acid under the conditions of 0.7 A/cm$^2$ of current density and 60 sec. of treatment time as shown in FIG. 3.

As a result of the observation, it was found that although the molten scattered Cu 6 and the overhang 5 were all removed, the thickness of the outerlayer copper layer 3 decreased (thinned) by about 50% due to the etching as shown in FIG. 4.

Thus, the outerlayer copper layer 3 is also etched in the same time when there is no laser absorbing layer 4 in carrying out the electrolytic molten scattered Cu etching.

Eighth Embodiment

A multilayer printed wiring board was fabricated in the same manner with the first embodiment while changing the electrolytic etching solution of the electrolytic molten scattered Cu etching in FIG. 1C in the direct via machining process to a chemical etching solution and a cross-section of the printed wiring board after the direct via machining process in FIG. 2E was observed. The chemical etching was carried out by using 0.8 mol/l of ammonium persulfate and 0.9 mol/l of sulfuric acid under conditions of 30° C. of solution temperature and 60 sec. of treatment time as shown in FIG. 3. The treatment time is a time required to completely remove the molten scattered Cu.

As a result of the observation, it was found that although the molten scattered Cu was completely removed, the overhang was slightly left. Still more, it was found that the thickness of the innerlayer wire 2 decreased by about 20% due to the etching in a via in which no smear was left at the bottom thereof.

Thus, the innerlayer wire 2 is etched in the same time in the via in which no smear is left at the bottom thereof when the chemical etching is adopted as the molten scattered Cu etching method.

Ninth Embodiment

A multilayer printed wiring board was fabricated in the same manner with the second embodiment while changing a type of the electrolytic etching solution of the electrolytic molten scattered Cu etching in FIG. 1C in the direct via machining process in the case of using the copper oxide obtained by the oxide conversion coating process as the laser absorbing layer 4 and a cross-section of the printed wiring board after the direct via machining process in FIG. 2E was observed. The treatment was carried out by using 0.8 mol/l of sodium sulfate as the electrolytic etching solution under conditions of pH 4.0 by controlling pH by sulfuric acid, 0.7 A/cm$^2$ of current density and 60 sec. of treatment time as shown in FIG. 3.

As a result of the observation, it was found that although the molten scattered Cu 6 and the overhang 5 had been completely removed, the outerlayer copper layer 3 was also etched and its thickness decreased by about 30% because the copper oxide film dissolved during the etching.

Thus, when the copper oxide is used as the laser absorbing layer 4, the outerlayer copper layer 3 is also etched because the copper oxide dissolves when the treatment is carried out by the acid electrolytic etching solution having pH 4.0.

Tenth Embodiment

A multilayer printed wiring board was fabricated in the same manner with the second embodiment while changing a type of the electrolytic etching solution of the electrolytic molten scattered Cu etching in FIG. 1C in the direct via machining process in the case of using the copper oxide obtained by the oxide conversion coating process as the laser absorbing layer 4 and a cross-section of the printed wiring board after the direct via machining process in FIG. 2E was observed. The treatment was carried out by using 7.0 mol/l of phosphoric acid having pH 1.0 that is generally known as a strongly acidic electrolytic etching solution as a copper etching solution under the conditions of 0.7 A/cm$^2$ of current density and 60 sec. of treatment time as shown in FIG. 3.

As a result of the observation, it was found that although the molten scattered Cu 6 and the overhang 5 had been completely removed, the outerlayer copper layer 3 was also etched and its thickness decreased by about 50% because the copper oxide film dissolved immediately after being soaked in the etching solution.

Thus, when the copper oxide is used as the laser absorbing layer 4, the outerlayer copper layer 3 is also etched because the copper oxide dissolves when the treatment is carried out by using the generally known strongly acidic electrolytic etching solution having pH 1.0 as the copper etching solution.

Although the invention has been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

What is claimed is:

1. A method of manufacturing a printed wiring board having a surface copper layer on the surface of the wiring board, an innerlayer copper layer, and an insulating layer separating the surface copper layer from the innerlayer copper layer, said method comprising:
    forming a laser absorbing layer on the surface of the surface copper layer, the laser absorbing layer being a copper oxide film;
    irradiating a laser to the laser absorbing layer to form a via reaching from the surface copper layer to the innerlayer copper layer;
    performing an electrolytic etching to remove unnecessary machining by-products generated around the via of the surface copper layer during said irradiating of the laser to form the via, the electrolytic etching being performed using an alkaline etching solution containing a material selected from a group consisting of (i) ammonium sulfate and sodium chloride, (ii) sodium sulfate, and (iii) potassium sulfate; and
    removing the laser absorbing layer.

2. The method of claim 1, wherein said performing electrolytic etching is carried out by applying a plus electric current by connecting a DC power source between an electrode facing the laser absorbing layer and the surface copper layer disposed on the surface of the wiring board.

3. The method of claim 1, wherein the electrolytic etching solution is controlled to be alkaline by using sodium hydroxide.

4. The method of claim 1, wherein said forming of the laser absorbing layer comprises forming the copper oxide film to have a thickness of at least 0.5 μm.

* * * * *